(12) United States Patent
Mitsui et al.

(10) Patent No.: US 7,217,481 B2
(45) Date of Patent: *May 15, 2007

(54) PHOTOMASK BLANK, PHOTOMASK, METHODS OF MANUFACTURING THE SAME AND METHODS OF FORMING MICROPATTERN

(75) Inventors: Masaru Mitsui, Tokyo (JP); Haruhiko Yamagata, Tokyo (JP); Masao Ushida, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/063,830

(22) Filed: Feb. 23, 2005

(65) Prior Publication Data
US 2005/0142463 A1    Jun. 30, 2005

Related U.S. Application Data

(63) Continuation of application No. 09/509,472, filed on Apr. 21, 2000, now Pat. No. 6,899,979.

(51) Int. Cl.
*G03F 7/00* (2006.01)
(52) U.S. Cl. .................... 430/5; 430/320; 430/322; 428/432
(58) Field of Classification Search .............. 430/5, 430/320, 322; 428/432
See application file for complete search history.

(56) References Cited

U.S. PATENT DOCUMENTS

| | | | |
|---|---|---|---|
| 4,363,846 A | 12/1982 | Kaneki | |
| 4,530,891 A | 7/1985 | Nagarekawa et al. | |
| 4,563,407 A | 1/1986 | Matsui et al. | |
| 4,720,442 A | 1/1988 | Shinkai et al. | |
| 4,958,083 A | 9/1990 | Sakamoto | |
| 5,230,971 A | 7/1993 | Alpay | |
| 5,470,661 A | 11/1995 | Bailey et al. | |
| 5,538,816 A | 7/1996 | Hashimoto et al. | |
| 5,592,317 A | 1/1997 | Fujikawa et al. | |

(Continued)

FOREIGN PATENT DOCUMENTS

EP    0 605 814 A1    7/1994

(Continued)

OTHER PUBLICATIONS

Kurt J. Lesker Company, Torus Sputter Sources, "Power Supplies, Monitors/Controllers, Accessories and Materials"; http://www.lesker.com/cfdocs/newweb/framesets/frameset_downloads.cfm; pp. 1-15.

*Primary Examiner*—Amanda Walke
(74) *Attorney, Agent, or Firm*—Oliff & Berridge, PLC

(57) ABSTRACT

In obtaining a photomask blank 1 by disposing a sputtering target in a vacuum chamber and forming thin films 3, 4, and 5 with a three-layer construction of CrN/CrC/CrON over a transparent substrate 2 by reactive sputtering, the thin films are formed in a mixed gas atmosphere containing helium, and the helium gas flux in the mixed gas is controlled such that the crystal grain diameter of the CrC thin film, which is the thickest film, will be 3 to 7 nm. This yields a photomask blank having thin films with low film stress, having good film quality, and which can be produced at a high yield in mass production.

16 Claims, 9 Drawing Sheets

U.S. PATENT DOCUMENTS

| | | |
|---|---|---|
| 5,738,959 A | 4/1998 | Miyashita et al. |
| 5,811,208 A | 9/1998 | Yokoyama et al. |
| 5,830,332 A | 11/1998 | Babich et al. |
| 5,935,735 A | 8/1999 | Okubo et al. |
| 5,942,356 A | 8/1999 | Mitsui et al. |
| 6,063,246 A | 5/2000 | Wolfe et al. |
| 6,087,047 A | 7/2000 | Mitsui et al. |
| 6,228,541 B1 | 5/2001 | Isao et al. |
| 6,265,696 B1 | 7/2001 | Sakurai et al. |
| 6,285,424 B1 | 9/2001 | Yoshida |
| 6,309,515 B1 | 10/2001 | Inoue et al. |
| 6,358,636 B1 | 3/2002 | Yang |

FOREIGN PATENT DOCUMENTS

| | | |
|---|---|---|
| EP | 0 724 022 | 7/1996 |
| GB | 2 325 473 A | 11/1998 |
| JP | 61-272746 | 12/1986 |
| JP | 11-12730 | 5/1989 |
| JP | 2-242252 | 9/1990 |
| JP | 4-9847 | 1/1992 |
| JP | 5-297570 | 11/1993 |
| JP | 8-225936 | 9/1996 |
| JP | 11-012730 | 1/1999 |

FIG.3
(a)
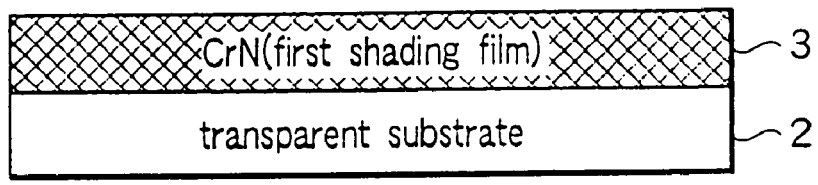
(b)
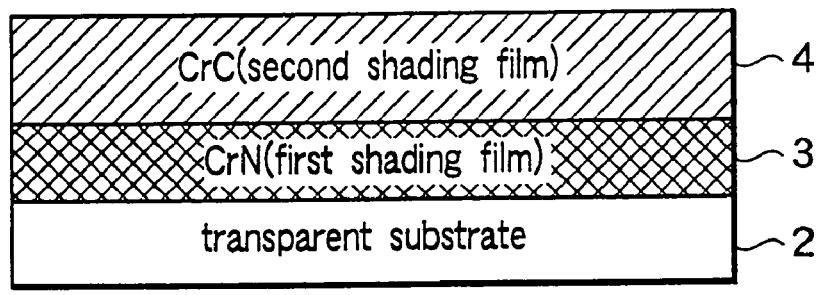
(c)
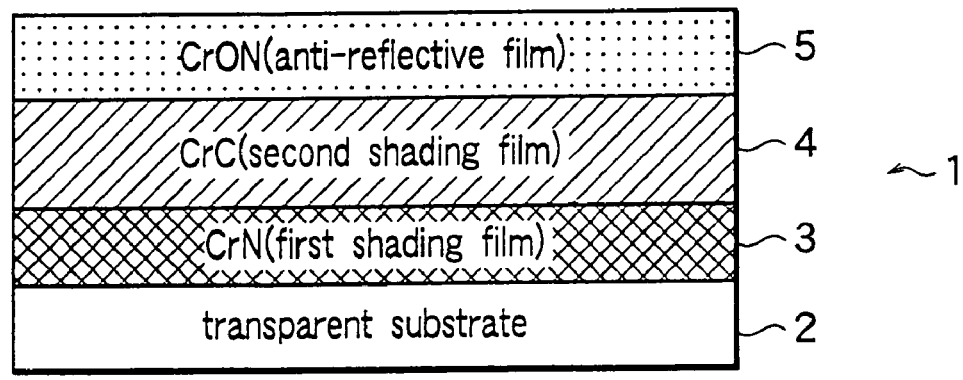

FIG.4
(a)
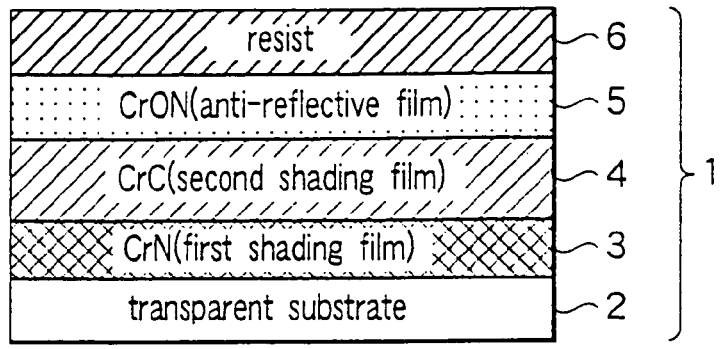
(b)
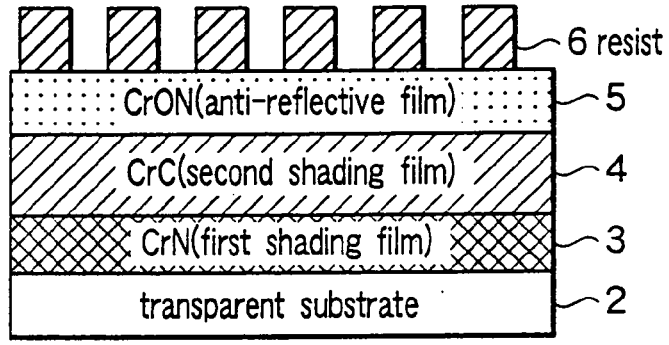
(c)
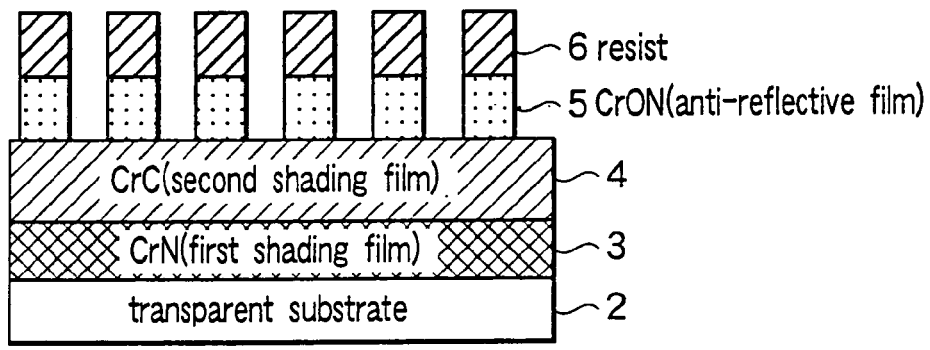
(d)
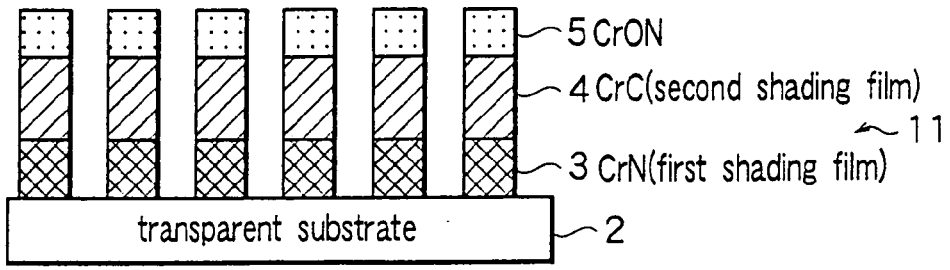

PHOTOMASK BLANK, PHOTOMASK, METHODS OF MANUFACTURING THE SAME AND METHODS OF FORMING MICROPATTERN

BACKGROUND

This invention relates to a photomask used as a photolithography mask for fine working in the process of manufacturing a semiconductor integrated circuit device or the like, to a photomask blank that is used to make this photomask, and to methods of manufacturing the same.

Photolithography has come to be used in recent years in the process of forming wiring and other regions in the manufacture of semiconductor integrated circuit devices. Known photomask blanks used as the exposure original in the photolithography process include those with a basic structure in which a shading film (light-shielding film, opaque film, non-transmitting film) of chromium (Cr) is formed over a transparent substrate, and those with a multilayer structure in which an anti-reflective film such as a chromium oxynitride (CrON) film is further laminated in order to prevent reflection on the shading film (light-shielding film, opaque film, non-transmitting film) surface produced by the exposure light.

The method employed to manufacture a photomask blank such as this involves introducing a transparent substrate into a vacuum chamber in which a sputtering target has been disposed, and forming a shading film (light-shielding film, opaque film, non-transmitting film) over the transparent substrate by reactive sputtering. With this film formation method, it is possible to raise the sputtering power in order to enhance the photomask blank productivity. Unfortunately, while raising the sputtering power does raise the film formation rate (that is, the deposition rate), if any impurities are present in the target, there is the possibility that there will be a higher incidence of particle generation in the formed thin film, which lowers the yield.

In view of this, in an effort to enhance productivity through a higher yield, the inventors investigated lowering the sputtering power in order to lower the film formation rate (that is, the deposition rate). It was found, however, that merely focusing on lowering the power (sputtering power) as one of the sputtering conditions only results in the following new problems.

Specifically, it was learned that if the film formation rates of the thin films that make up the photomask blank are each lowered, in general, the crystal grains of the film deposited on the transparent substrate will be larger, and this will be attended by extremely large film stress caused by the crystal grains pulling on one another. The mechanism by which this film stress is generated is not entirely clear, but it is thought to be attributable to the deposition rate of the films. In the case of a photomask blank made up of chromium-based thin films, such as a photomask blank having a three-layer structure of CrN/CrC/CrON, it was found that this problem is particularly serious with the CrC thin film, which is the thickest of the three. Further examination of the situation by the inventors revealed that film stress also greatly affects the film materials that make up the thin films. This problem with stress was found to be particularly serious with chromium-based thin films, with chromium carbide films in which the chromium contains carbon, and with chromium oxide films in which the chromium contains oxygen.

Tensile stress occurs and leads to substrate warping in a photomask blank including thin films manufactured through a series of manufacturing steps and having the above-mentioned film stress, and in the photomask obtained by patterning this photomask blank. Therefore, if a photomask is produced from a photomask blank such as this, there is the danger that the patterning precision will not be as designed, producing defective products. Specifically, wiring design is important in the manufacture of a semiconductor integrated circuit device, and if a photomask such as this is used to transfer a pattern to a semiconductor wafer or the like, the pattern will not be formed as designed on the semiconductor wafer, resulting in circuit malfunction, and therefore this photomask cannot be used and is a defective product.

In view of this, the inventors investigated a method of manufacturing a photomask blank with which it is possible to avoid the problem of film stress in thin films formed under film formation conditions (film sputtering conditions) involving sputtering at low power as mentioned above.

Aside from the sputtering power conditions, the material of the thin films that make up the photomask blank is determined on the basis of the following sputtering conditions, and the inventors therefore conducted investigations and experiments into various parameters.

First, they investigated the gas pressure used in sputtering. Gas pressure was the only sputtering condition they focused on, and other parameters were kept constant in the experiments and investigations.

FIG. 11 is a graph of the relationship between the gas pressure during the formation of CrC and the change in substrate warping attributable to film stress for a photomask blank in which CrN/CrC/CrON is formed over a transparent substrate. Here, the change in substrate warping is the change in flatness, and this change in flatness is defined as the difference between the initial flatness (the flatness of the transparent substrate at the outset) and the flatness after the thin films have been formed over the transparent substrate. As to the symbols used for the change in flatness, a minus sign indicates a change in tensile stress, and a plus sign indicates a change in compressive stress. Flatness was measured using an AS8010 made by Tropel. It is clear from this graph that there is less change when the gas pressure is lower, and more change when the gas pressure is higher (the film stress is greater). In other words, these investigative results reveal that it is undesirable for the gas pressure to be raised because the deposition rate will be too low and the change in flatness will be greater (film stress will be greater), and that it is undesirable for the gas pressure to be lowered because film formation stability (film sputtering stability) will be poor.

Next, the types of gas that make up the mixed gas were investigated. Experiments and investigations were conducted for when the gas components were the only sputtering condition examined, the power and gas pressure were not varied, and other parameters were set to constant values.

A method in which a reactive gas is mixed into an inert gas for the gas used in sputtering is generally employed to control the stress of the films. The inventors first turned their attention to the reactive gas, and conducted sputtering using nitrogen (N) as the reactive gas, for example. As a result, it was found that if the amount of nitrogen is too large, abnormal discharge will generate particles. It was thus revealed that there is a limit to how much reactive gas N (nitrogen) can be introduced, so the components of the mixed gas must be used in appropriate amounts (the amount of reactive gas in the inert gas). For instance, when a photomask blank comprising an anti-reflective film of CrON formed over a shading film (light-shielding film, opaque film, non-transmitting film) of CrC is used for a low-wavelength application (such as 365 nm), the CrON must be made thin due to optical characteristic requirements. The amount of nitrogen monoxide (NO) gas introduced as the reactive gas was reduced in order to make the CrON film thinner, but this generated film stress due to a decrease in nitrogen (N) atoms in the CrON film. On the other hand, excessively increasing the amount of nitrogen monoxide (NO) gas introduced as the reactive gas during the formation of the above-mentioned CrON film resulted in abnormal discharge during sputtering due to the effect of the nitrogen (N) atoms, and consequently the above-mentioned problem with particles resulted in poor film quality. Therefore, it was revealed that even if the amount of nitrogen (N) introduced as the reactive gas is optimized, it will still be very difficult to achieve optimal sputtering conditions in terms of the relation between introduction amount and film quality.

Thus, when films were formed by changing the various parameters of the film formation conditions (film sputtering conditions) for film stress, namely, the gas pressure, gas flow ratio, sputtering power, and so forth, it was extremely difficult to control both the optical characteristics and the film quality (changes in the optical characteristics of the formed film, changes in film quality, etc.). Therefore, an attempt was made to achieve the above-mentioned goal by looking for an inert gas with good controllability as the type of gas that makes up the above-mentioned mixed gas under the condition that the power during sputtering will be lowered.

The present invention was conceived in light of the above problems, and it is an object thereof to provide a photomask blank and photomask that have thin films with low film stress, have good film quality, and can be mass-produced at a high yield, which is accomplished by changing the constitution of the mixed gas, and to provide methods of manufacturing the same.

SUMMARY

As means for solving the above problems, the first invention is a photomask blank comprising a thin film having at least a shading function (light-shielding function, opaque function, non-transmitting function) formed over a transparent substrate, wherein the thin film contains helium.

The second invention is a photomask blank comprising a thin film having at least a shading function (light-shielding function, opaque function, non-transmitting function) formed over a transparent substrate, wherein the thin film is formed by sputtering in which a sputtering target is disposed in a vacuum chamber into which an atmosphere gas has been introduced, and the thin film is formed at a deposition rate of 0.5 nm/sec to 6 nm/sec, and the helium gas content is 30 to 90 vol % in the atmosphere gas.

The third invention is the photomask blank according to the first or second invention, wherein the thin film contains at least one of carbon or oxygen.

The fourth invention is a the photomask blank according to the third invention, wherein the thin film is a laminated film including a shading film (light-shielding film, opaque film, non-transmitting film) that contains carbon, and an anti-reflective film that contains oxygen.

The fifth invention is the photomask blank according to the fourth invention, wherein the thin film has an oxygen content that continuously decreases and a carbon content that continuously increases from the thin film surface side to the transparent substrate side.

The sixth invention is the photomask blank according to the fourth or fifth invention, wherein the carbon content is 0 to 25 at % and the oxygen content is 0 to 70 at %.

The seventh invention is the photomask blank according to any of the first to sixth inventions, wherein the thin film further contains nitrogen.

The eighth invention is the photomask blank according to any of the first to seventh inventions, wherein the thin film has a crystal grain size of 1 to 7 nm.

The ninth invention is the photomask blank according to any of the first to eighth inventions, wherein a nitride film containing nitrogen and the same metal material contained in the thin film is formed between the transparent substrate and the thin film.

The tenth invention is the photomask blank according to any of the first to ninth inventions, wherein the thin film has an oxygen content that continuously decreases and a carbon content that continuously increases from the thin film surface side to the transparent substrate side, nitrogen is contained in the nitride film in a relatively greater amount than the amount of nitrogen contained in the thin film, and the amount of the metal decreases as the amount of nitrogen in the nitride film increases.

The eleventh invention is the photomask blank according to any of the first to tenth inventions, wherein the thin film contains chromium.

The twelfth invention is the photomask blank according to any of the first to eleventh inventions, wherein the transparent substrate is composed of quartz glass.

The thirteenth invention is a photomask on which a mask pattern has been formed by the patterning of the thin film formed on the transparent substrate of the photomask blank pertaining to any of the first to twelfth inventions, or of the thin film and the nitride film.

The fourteenth invention is a method of manufacturing a photomask blank, in which a sputtering target is disposed in a vacuum chamber into which an atmosphere gas has been introduced, and at least a thin film having a shading function (light-shielding function, opaque function, non-transmitting function) is formed over a transparent substrate by sputtering, wherein the correlation between the amount of helium gas contained in the atmosphere gas and the film stress of the thin film is determined ahead of time, the helium gas content is determined from said correlation so that the thin film will have a film stress such that the mask pattern obtained when the thin film is patterned will have the desired pattern position precision, and the thin film is formed by sputtering in an atmosphere gas having this helium gas content.

The fifteenth invention is a method of manufacturing a photomask blank, in which a sputtering target is disposed in a vacuum chamber into which an atmosphere gas has been introduced, and at least a thin film having a shading function (light-shielding function, opaque function, non-transmitting function) is formed over a transparent substrate by sputtering, wherein the thin film is formed at a deposition rate of 0.5 nm/sec to 6 nm/sec, and the atmosphere gas contains helium gas.

The sixteenth invention is a method of manufacturing a photomask blank, in which a sputtering target is disposed in a vacuum chamber into which an atmosphere gas has been introduced, and at least a thin film having a shading function (light-shielding function, opaque function, non-transmitting function) is formed over a transparent substrate by sputtering, wherein the thin film is formed at a sputtering power of 950 to 3000 W, and the atmosphere gas contains helium gas.

The seventeenth invention is the method of manufacturing a photomask blank according to any of the fourteenth to sixteenth inventions, wherein the helium gas content is 30 to 90 vol % in the atmosphere gas.

The eighteenth invention is the method of manufacturing a photomask blank according to the seventeenth invention, wherein the helium gas content is 40 to 65 vol % in the atmosphere gas.

The nineteenth invention is the method of manufacturing a photomask blank according to any of the fourteenth to eighteenth inventions, wherein the thin film contains at lease one of carbon or oxygen.

The twentieth invention is the method of manufacturing a photomask blank according to the nineteenth invention, wherein the thin film is a laminated film including a shading film (light-shielding film, opaque film, non-transmitting film) that contains carbon, and an anti-reflective film that contains oxygen, and at least one of the shading film (light-shielding film, opaque film, non-transmitting film) or the anti-reflective film is formed by sputtering in an atmosphere gas containing helium gas.

The twenty-first invention is the method of manufacturing a photomask blank according to any of the fourteenth to twentieth inventions, wherein a nitride film containing nitrogen and the same metal contained in the thin film is formed between the transparent substrate and the thin film.

The twenty-second invention is the method of manufacturing a photomask blank according to any of the fourteenth to twenty-first inventions, wherein the thin film, or the thin film and the nitride film, is or are formed by inline sputtering.

The twenty-third invention is the method of manufacturing a photomask blank according to any of the fourteenth to twenty-second inventions, wherein the thin film contains chromium.

The twenty-fourth invention is the method of manufacturing a photomask blank according to any of the fourteenth to twenty-third inventions, wherein the transparent substrate is composed of quartz glass.

The twenty-fifth invention is a method of manufacturing a photomask, wherein a mask pattern is formed by selectively removing the film formed on the transparent substrate of a photomask blank obtained by the manufacturing method pertaining to the invention in any of the fourteenth to twenty-fourth inventions.

The twenty-sixth invention is a method of forming a fine pattern, in which a fine pattern is formed over a substrate by photolithography, wherein the photomask according to the thirteenth invention is used as the mask used in transferring the fine pattern.

BRIEF DESCRIPTION OF THE DRAWINGS

FIG. 3 is a diagram of the procedure in the steps (a) to (c) for manufacturing the photomask blank in Example 1 of the present invention;

FIG. 4 is a diagram of the procedure in the steps (a) to (d) for manufacturing the photomask blank in Example 1 of the present invention;

DETAILED DESCRIPTION OF EMBODIMENTS

EXAMPLE 1

Figure 1:
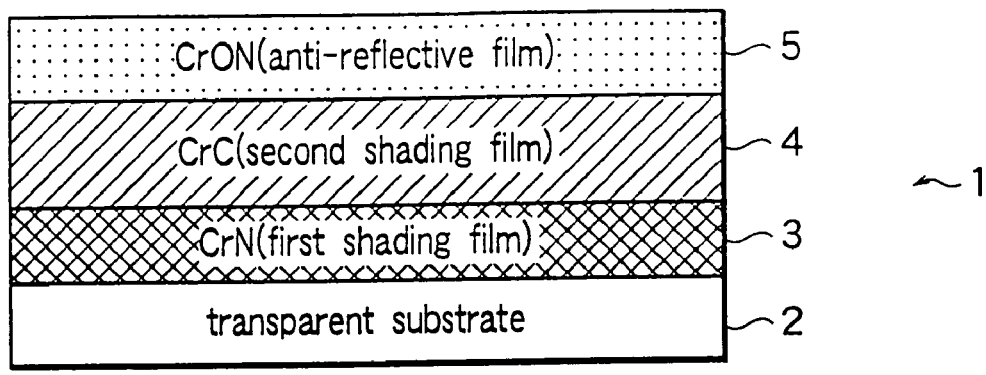
FIG. 1 is a cross section of the photomask blank in Example 1 of the present invention.
Figure 2:
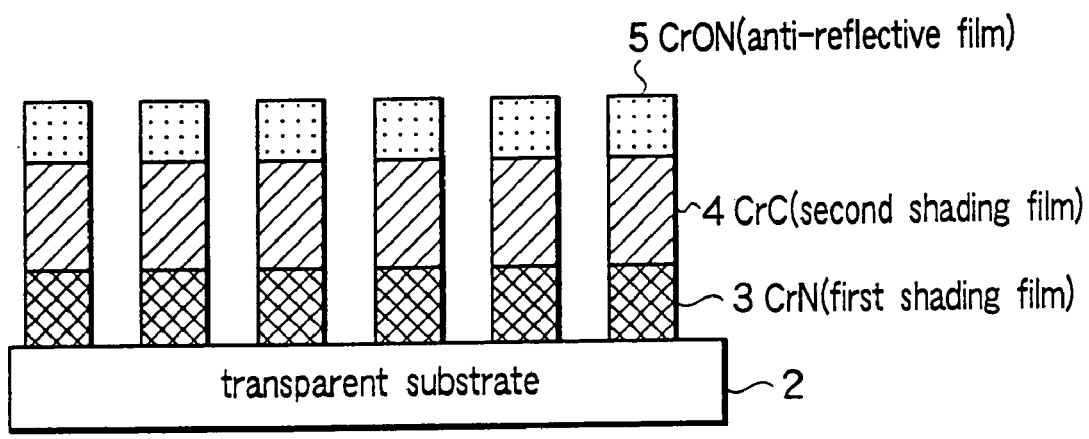
FIG. 2 is a cross section of the photomask in Example 1 of the present invention.

FIG. 1 is a cross section of the photomask blank pertaining to Example 1, and FIG. 2 is a cross section of the photomask in Example 1.

With the photomask blank 1 pertaining to Example 1 shown in FIG. 1, a quartz glass substrate measuring 5 inches×5 inches×0.09 inch an whose main surface and end face had undergone precision polishing was used as the transparent substrate 2. Over this transparent substrate 2 were formed a chromium nitride (CrN) film (Cr: 80 atomic %, N: 20 atomic % (hereafter called at %); film thickness 150 Å) as a first shading film (light-shielding film, opaque film, non-transmitting film) 3, a chromium carbide (CrC) film (Cr: 94 at %, C: 6 at %; film thickness: 600 Å) as a second shading film (light-shielding film, opaque film, non-transmitting film) 4, and a chromium oxynitride (CrON) film (Cr: 30 at %, O: 45 at %, N: 25 at %; film thickness: 250 Å) as an anti-reflective film 5.

Here, the surface reflectance of the anti-reflective film 5 (CrON film) is determined by the amounts of oxygen and nitrogen contained in the anti-reflective film 5, and is controlled by suitably checking the film thickness. To control surface reflectance, the composition is generally selected so as to minimize reflectance dependence with respect to film thickness near the wavelength of the exposure light.

The photomask 11 shown in FIG. 2 is formed by etching the photomask blank 1 of FIG. 1.

Next, the characteristics of the photomask blank 1 in terms of manufacturing, and the effect thereof as a photomask blank 1, will be described.

FIGS. 3 and 4 are schematic cross sections illustrating the methods for manufacturing the photomask blank 1 of Example 1 and the photomask 11 of Example 1, respectively.

Here, a CrN film with a thickness of 150 Å was formed as the first shading film (light-shielding film, opaque film, non-transmitting film) 3 as shown in FIG. 3(a) by reactive sputtering using the transparent substrate 2 measuring 5 inches×5 inches×0.09 inch and whose main surface and side faces (end faces) had undergone precision polishing, and using a chromium target in a mixed gas atmosphere of argon and nitrogen (Ar: 80 vol %, $N_2$: 20 vol %, pressure: 0.3 Pa). The CrN film thus obtained had a nitrogen content of 20 at %.

In addition to quartz, the above-mentioned transparent substrate 2 can also be fluorite, various types of glass (such as soda lime glass, aluminosilicate glass, or aluminoborosilicate glass), calcium fluoride, magnesium fluoride, silicon, or the like.

Quartz glass that absorbs little light with wavelength in the ultraviolet region, as is the case with the exposure light, is particularly good as the transparent substrate 2, but quartz glass generally results in more film stress than soda lime glass or aluminoborosilicate glass, which is thought to be due to different crystal seeds or differences in the coefficient of thermal expansion with a chromium film. Therefore, the present invention is suited to combination with a quartz glass substrate which is suitable as a glass substrate for a photomask.

Then, a CrC film with a thickness of 600 Å was formed as the second shading film (light-shielding film, opaque film, non-transmitting film) 4 as shown in FIG. 3(b) by reactive sputtering using a chromium target in a mixed gas atmosphere composed of argon methane and helium (Ar: 30 vol %, $CH_4$: 10 vol %, He 60 vol %, pressure 0.3 Pa, sputtering power: 1650 W, deposition rate: 3.4 nm/sec). The carbon content in the CrC film of the above photomask blank 1 was measured and found to be 6 at %, and the etching rate was 0.3 nm/sec. The crystal grain diameter of the CrC film was measured by transmission electron microscope (TEM) and found to be 1 to 7 nm.

The method of the present invention for manufacturing a photomask blank solves the problems mentioned above by having the helium serving as the inert gas be contained as a type of mixed gas. FIG. 3(b) here shows an example in which the helium content in the mixed gas is 60 vol %, but the proportions in which the gases are mixed in this mixed gas will be discussed in detail below on the basis of experimental results.

A CRON film with a thickness of 250 Å was formed as the anti-reflective film 5 as shown in FIG. 3(c) over the above-mentioned CrC film by reactive sputtering using a chromium target in a mixed gas atmosphere of argon and nitrogen monoxide (Ar: 80 vol %, NO: 20 vol %, pressure: 0.3 Pa), with this film being formed continuously with the CrC film. Ultrasonic washing was performed to obtain the photomask blank 1.

The oxygen and nitrogen contents in the CRON film of the above photomask blank 1 were measured and found to be 45 at % oxygen and 25 at % nitrogen. The optical characteristics of the photomask blank 1 produced in this manner were measured using a commercially available apparatus, and at a wavelength of 365 nm, the optical density was 3.0 and the surface reflectance was 12%. There were no defects in any of the films, meaning that the film quality was good.

The sheet resistance was measured for the photomask blank 1 of CrN/CrC/CrON films finally obtained, whereupon the conductivity was good, being 25 ohms per square or less. This indicates that charges tend not to build up between the CrON film and the resist during electron exposure.

The helium contained in the photomask blank 1 was analyzed by thermal desorption gas analyzer (TDS). This thermal desorption is an analysis method for identifying by mass spectrometer the composition of desorbed gas when a sample is subjected to programmed heating.

The specific heating method used for this analysis involved guiding the light from an infrared lamp outside the vacuum system into a measurement chamber through a rod of molten quartz, which is highly transparent, and placing a sample holder made of the above-mentioned opaque quartz on the upper end of the rod. A sample cut out in a size of 10 $mm^2$ from the photomask blank 1 obtained above is placed on the opaque quartz sample holder of the thermal desorption gas analyzer, and the sample is heated by infrared rays from below. The sample temperature is measured by a thermocouple in contact with the thin film surface. Here, the degree of vacuum was approximately $4 \times 10^{-7}$ Pa and the temperature elevation rate was 10 to 60° C./min, and the measurement was made with a mass spectrometer for the gas desorption behavior of mass number (m/e)=4 (He) when the room temperature was varied up to approximately 850° C.

Figure 7:
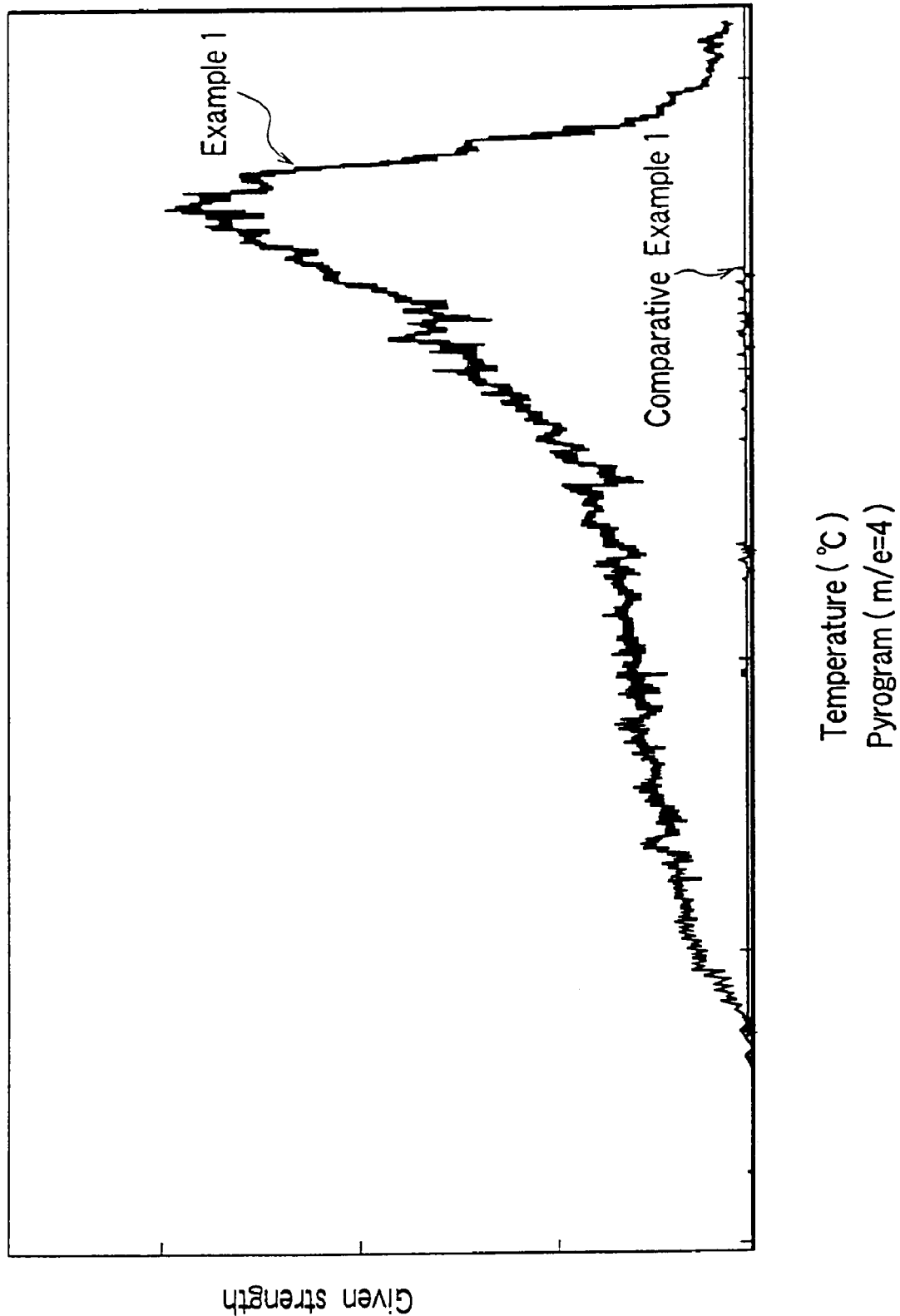
FIG. 7 is a graph of the thermal desorption gas analysis results (pyrogram) with helium for the photomask blank 1 in Example 1.

FIG. 7 is a graph of the thermal desorption gas analysis results (pyrogram) with helium for the photomask blank 1, and shows the change in the amount of desorption of the mass number (m/e)=4 as a function of the sample temperature. The term pyrogram as used here refers to a graph on which the horizontal axis is graduations of temperature, and the vertical axis is graduations of a specified mass number (here, 4 (He)) output. The horizontal axis in FIG. 7 is the sample temperature, and the vertical axis is the amount of desorption for a mass number (m/e)=4 measured by mass spectrometer, expressed at a given intensity.

It was confirmed from the above results that the photomask blank 1 contains helium (He) in the films, with desorption of a mass number (m/e)=4 (He) observed.

This desorption of helium is preferably carried out from at least the temperature at which the resist film is baked, which is performed in the formation of the mask pattern. More specifically, the desorption of helium should be at 250° C. or higher.

The change in flatness was measured by the same method as described above, whereupon it was confirmed that there was little change (−1.4 μm), and the film stress was low.

Thus, if helium is contained as a mixed gas in sputtering in the formation of the chromium carbide film, the diameter of the grains forming the CrC will be small (1 to 7 nm), a good thin film with no film stress will be obtained, and a photomask blank 1 with little change in flatness will be obtained. The mechanism of this is not certain, but is surmised to be that while the crystals of the CrC film become fine, they are not amorphous, and the admixture of helium (He) atoms that do not participate in the bonding of the chromium grains hinders the crystal growth of the chromium while the CrC is being formed.

As shown in FIGS. 4(a), a resist 6 was applied by coating over the CRON film serving as the anti-reflective film 5, and this was subjected to pattern exposure and developing to form a resist pattern as shown in FIG. 4(b). CrON not only has an anti-reflective function, but also has an anti-oxidizing function, and consequently its durability is good and it exhibits good characteristics for a photomask blank 1. Thus, adhesion is good with the resist used in a subsequent step, and the above-mentioned patterning can be carried out stably and to high precision.

Then, after the above-mentioned patterning, an etching solution produced by adding pure water to 165 g of ceric ammonium nitrate and 42 mL of perchloric acid (70% concentration) to bring the total to 1000 mL was held at 19 to 20° C., wet etching was performed with this etching solution, and the CRON film was patterned as shown in FIG. 4(c) using the above-mentioned resist pattern as a mask.

The patterning of the CrON film, the patterning of the CrC film, and the patterning of the CrN film were continuously carried out through this wet etching, and after the above-mentioned resist was removed by a standard method using an oxygen plasma or sulfuric acid, the photomask 11 having the desired pattern was obtained as shown in FIG. 4(d). The positional precision of the mask pattern in the photomask 11 thus obtained was measured and found to be extremely good, deviating hardly at all from the design values.

The helium (He) content in the mixed gas used in the present invention will now be described. First, because nitrogen is admixed as a film formation component during the formation of the CrN film in Example 1 above, the crystal grain diameter is small and the film is thin, so film stress poses no problem, and a good thin film can be obtained as above by not having any helium contained in the mixed gas and by controlling the nitrogen used as the reactive gas. As to the CrC film, when the film is formed over the substrate, the chromium and carbon exhibit tensile stress changes, so the mixed gas contained not only argon, but also 60 vol % helium. As to the CrON film, a film containing chromium and oxygen tends to exhibit these same tensile stress changes, but because nitrogen is contained, and because the film is relatively thin, the mixed gas was not made to contain any helium.

Figure 5:
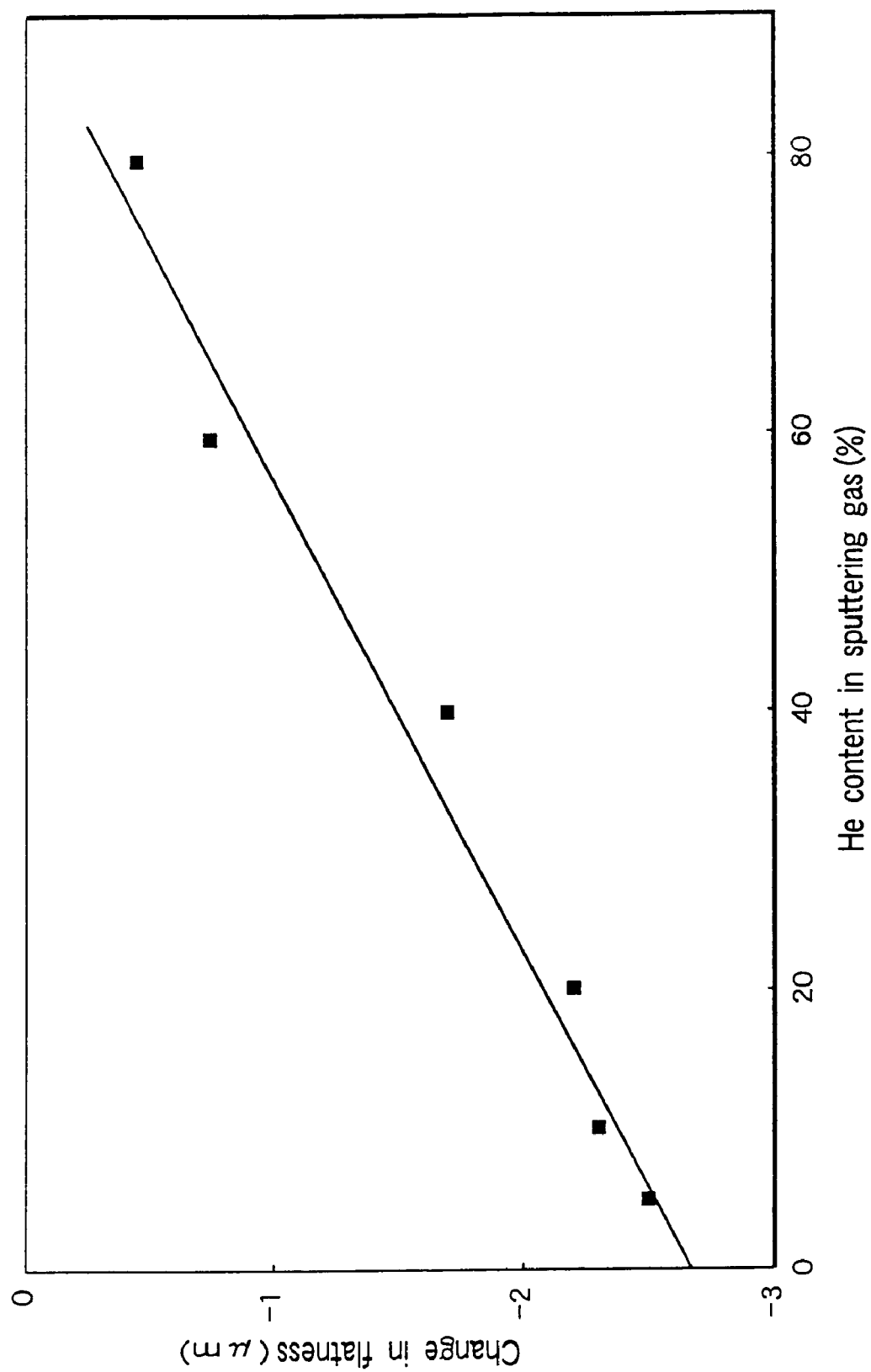
FIG. 5 is a graph of the relationship between helium content and substrate warping (change in flatness) when the manufacturing method of the present invention is carried out.

FIG. 5 is a graph of the relationship between the helium content in the mixed gas during the formation of the CrC film, and the change in substrate warping (change in flatness) attributable to stress. If the helium content is increased in order to ensure good control of sputtering, then the discharge will be unstable, so the helium content in the mixed gas must be no more than 90 vol %. Due to the relationship with gas pressure, the highest film quality was achieved when the helium content in the mixed gas was about 40 to 65 vol %. The deposition rate of the thin film at this time was approximately 4 nm/sec, and the change in flatness resulting from the formation of a film over the transparent substrate was extremely small (approximately −1.3 μm).

Even when the helium content in the mixed gas was about 40 vol %, a good film could be obtained by adjusting the sputtering power. When the helium content in the mixed gas was lowered to about 30 vol %, the change in flatness was approximately −1.8 μm, but the positional precision of the mask pattern in the photomask 11 produced using this photomask blank 1 was within a range that can be identified as passable. In terms of the positional precision of the mask pattern, it is preferable for the change in flatness to be −2 μm or less.

When the etching rate is considered, it is preferable for the content of components other than helium in the mixed gas to be adjusted according to the film quality. With this in mind, the helium content in the mixed gas should be 30 to 90 vol %, and preferably 40 to 65 vol %.

Although not shown in the graph, a photomask blank 1 was produced by further lowering the sputtering power and setting the thin film deposition rate to 0.5 nm/sec, but no film stress that would pose a problem was generated, and the photomask blank 1, as well as the photomask 11 produced using this blank, underwent little change in flatness and has good pattern positional precision, within the passable range. Conversely, when a photomask blank 1 was produced by raising the sputtering power and setting the thin film deposition rate to approximately 6 nm/sec, no particles that would pose any particular problem were observed in the thin film, and the photomask blank 1, as well as the photomask 11 produced using this blank, were within the passable range. The sputtering gas pressure here was 0.2 to 0.6 Pa, and the sputtering power was 950 to 3000 W. Preferably, due to the relationship with the film stress and film defects, the sputtering power should be 1200 to 2000 W.

m/e=4 (helium) desorption was observed with a thermal desportion gas analyzer, and it was shown that the films contained helium in the photomask blank 1 of Example 1 produced under the above sputtering conditions, but when the helium gas content in the mixed gas was varied to 80 vol %, 60 vol %, and 40 vol % and the m/e=4 relative intensity (helium) was confirmed to increase in proportion to the helium content in the mixed gas. This tells us that the amount of helium contained in a film obtained by sputtering can be adjusted by adjusting the helium content in the mixed gas. The above-mentioned relative intensity is the quotient of dividing the integral intensity ratio in the pyrogram FIG. 7 by the sample surface area ratio (in this case, the relative intensity was set at 1 when the helium gas content was 80 vol %).

Thus, at least when forming the CrC film, film stress can be suppressed by introducing helium gas into the atmosphere gas, and a photomask blank 1 with good film quality can be obtained while ensuring a high yield, without any adverse effect of impurities from the target. Also, no particular film stress occurred when the CrC film was formed in a thickness of approximately 250 to 1100 Å and the CrON film in a thickness of approximately 200 to 300 Å, and it was possible to obtain a good photomask blank 1, as well as a good photmask 11 using this blank. It is also possible to suppress film stress by introducing helium gas during the formation of not only the CrC film but also the CRON film. A photomask blank 1 having even better film quality is obtained in this case.

EXAMPLE 2

There are no particular restrictions on the sputtering apparatus in Example 1, but we described an example of forming a film by reactive sputtering which is applicable to a standard sputtering apparatus. In other words, Example 1 can be applied to a method in which, for example, a sputtering target is disposed within a vacuum chamber, and the various types of film are formed one at a time in each reaction chamber by batch process and reactive sputtering.

Figure 6:
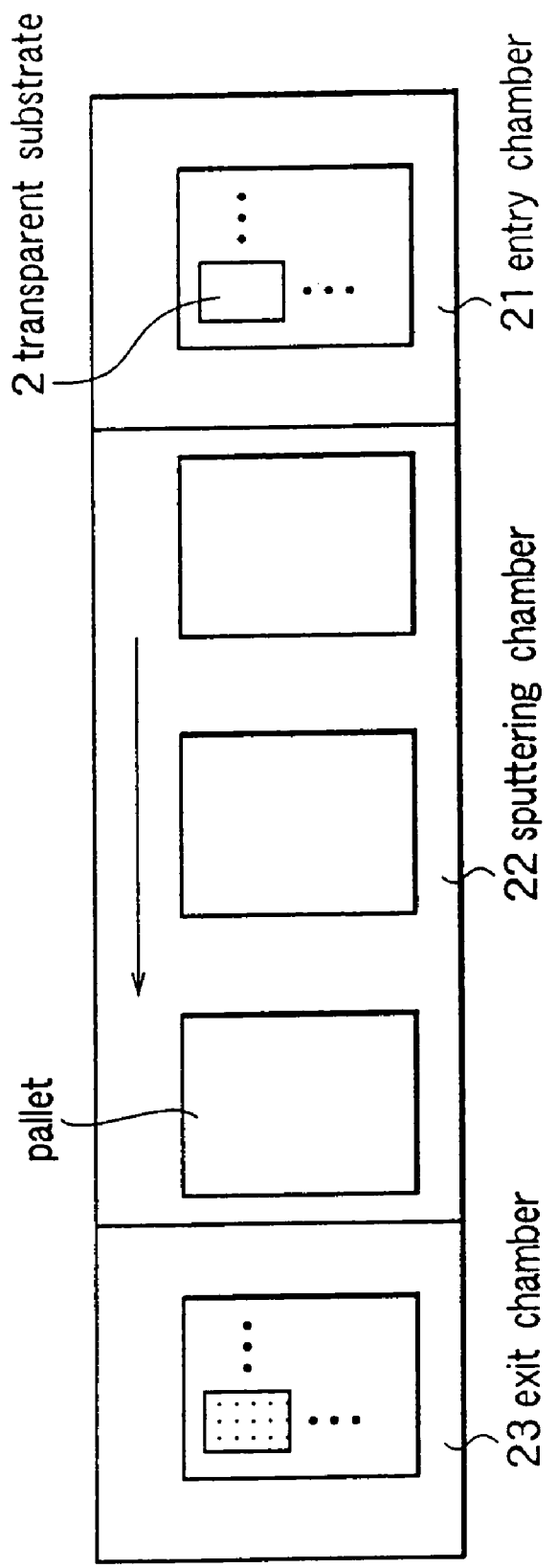
FIG. 6 is a simplified structural diagram of an inline continuous sputtering apparatus for implementing the manufacturing method of the present invention.

The use of an inline continuous sputtering apparatus in the manufacture of photomask blanks has become prevalent in recent years in order to boost productivity. In view of this, it is conceivable that an inline continuous sputtering apparatus will be used in the method of the present invention for manufacturing a photomask blank in an effort to achieve further increases in productivity. FIG. 6 is a simplified diagram of an inline continuous sputtering apparatus. An inline continuous sputtering apparatus continuously applies films over several transparent substrates carried on a pallet, and a series of film applications is carried out while the substrates are conveyed through a single vacuum chamber. Therefore, since a plurality of types of film are formed by sputtering in a single chamber (same degree of vacuum) in this case, the setting of manufacturing conditions unique to inline sputtering is important in order to obtain good quality in these films. The substrate conveyance speed is closely linked to production efficiency in inline sputtering, but if the conveyance speed is raised with an eye to production efficiency, particles will tend to be produced in the conveyance mechanism that conveys the pallets on which the substrates are held, resulting in a decrease in yield. Consequently, when sputtering is performed at a lower pallet conveyance speed, the films generally have to be formed at a lower deposition rate, and as a result, not only does production efficiency drop, but film stress also occurs. In Example 2, we will describe a method in which an inline continuous sputtering apparatus is applied in the manufacture of a photomask blank and photomask that have low film stress and good film quality, and that can be mass-produced at a high yield.

The method described in Example 2 is a manufacturing method in which the technique of Example 1 is applied to inline continuous sputtering, which is an effective method for forming films that lends itself to mass production. Specifically, the difference between an ordinary sputtering apparatus and the inline continuous sputtering apparatus of Example 2 is that a plurality of targets are disposed in an inert gas atmosphere such as argon, and a plurality of types of film are continuously formed on transparent substrates while the transparent substrates are continuously conveyed between sputtering targets at a specific conveyance speed.

Figure 8:
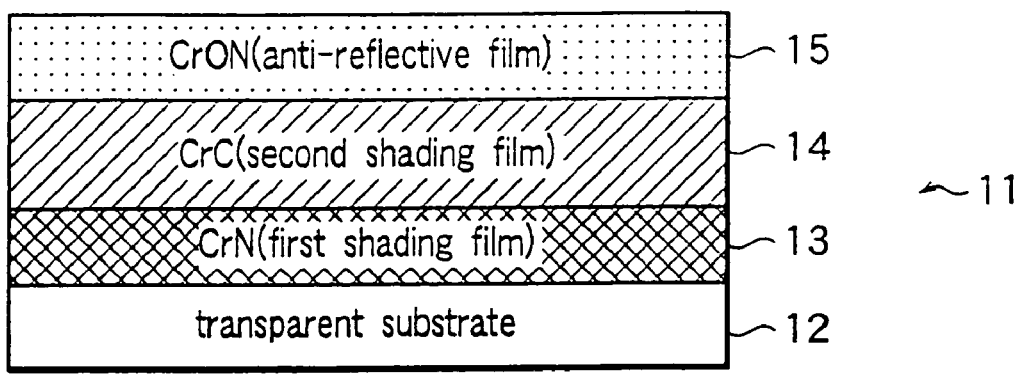
FIG. 8 is a cross section of the photomask blank in Example 2 of the present invention.
Figure 9:
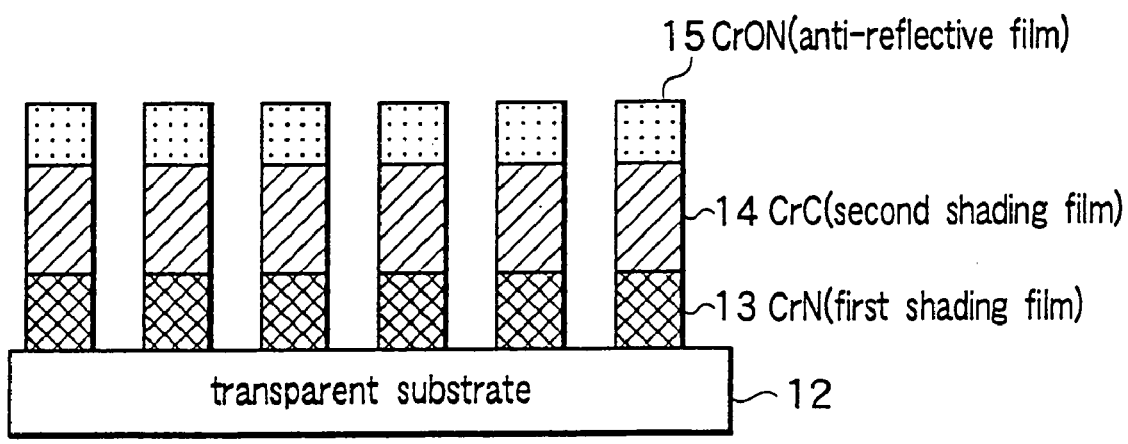
FIG. 9 is a cross section of the photomask in Example 2 of the present invention.

FIG. 8 is a cross section of the photomask blank in Example 2, and FIG. 9 is a cross section of the photomask in Example 2.

With the photomask blank 31 pertaining to the example shown in FIG. 8, a quartz glass substrate measuring 5 inches×5 inches×0.09 inch and whose main surface and end faces had undergone precision polishing was used as the transparent substrate 12. Over this transparent substrate 12 were formed the first shading film (light-shielding film, opaque film, non-transmitting film) 13 composed of chromium nitride film containing chromium and nitride (film thickness: 150 Å), a second shading film (light-shielding film, opaque film, non-transmitting film) 14 composed of a chromium carbide film containing chromium and carbide (film thickness 600 Å), and an anti-reflective film 15 composed of a chromium oxynitride film containing chromium, oxygen, and nitrogen (film thickness: 250 Å). The photomask 32 shown in FIG. 9 was patterned by etching the photomask blank of FIG. 8.

Next, the methods for manufacturing the photomask blank 31 and photomask 32 of the present invention in Example 2 will be described. The transparent substrates 12 composed of quartz glass and measuring 5 inches×5 inches× 0.09 inch and whose main surface and end faces have undergone precision polishing are put on a substrate holder (pallet) and introduced into the inline continuous sputtering apparatus shown in FIG. 6. In the simplest terms, this inline sputtering apparatus consists of three chambers as shown in FIG. 6: an entry 21, a sputtering chamber (vacuum chamber) 22, and an exit chamber 23. These chambers are separated by partitions. The transparent substrates 12 loaded on the pallet are conveyed in the direction of the arrow in the figure. The structure of the various chambers will be described in the pallet conveyance direction.

The entry chamber 21 is purged of air to create a vacuum on the inside. In the next chamber, the sputtering chamber 22, are formed shading films (light-shielding films, opaque films, non-transmitting films), such as chromium nitride (CrN) containing chromium and nitrogen (the first shading film (light-shielding films, opaque films, non-transmitting film) 13) and chromium carbide (CrC) containing chromium and carbon (the second shading film (light-shielding films, opaque films, non-transmitting film) 14), and anti-reflective film 15, such as chromium oxynitirde (CrON) containing chromium, oxygen, and nitrogen. In other words, the film formation steps illustrated in FIG. 3 are carried out. Although not shown in the figures, a plurality of chromium targets for forming the first and second shading films 13, 14 (light-shielding films, opaque films, non-transmitting films) and the anti-reflective film 15 are provided inside the sputtering chamber 22, and a plurality of valves for introducing atmosphere gas are provided near these targets. The last chamber, the exit chamber 23, is purges of air to create a vacuum on the inside, just as with the entry chamber 21.

When a photomask blank 31 is manufactured using the inline continuous sputtering apparatus described above, the first step is to introduce a pallet loaded with the quartz glass transparent substrates 12 into the entry chamber 21. The entry chamber 21 is then changed from the atmospheric pressure to a vacuum, after which the pallet is conveyed into the sputtering chamber 22.

In this sputtering chamber 22, the transparent substrates 12 loaded on the pallet are conveyed at a speed of 25 cm/min. At the first target, a mixed gas of Ar and $N_2$ (Ar: 80 vol %, $N_2$: 20 vol %) is introduced through the first valve, and a chromium nitride (CrN) film formed as the first shading film (light-shielding film, opaque film, non-transmitting film) 13 (see FIG. 3(a)) in a thickness of 150 Å by reactive sputtering. At the second target, a mixes gas of Ar, $CH_4$, and He (Ar: 30 vol %, $CH_4$: 10 vol %, He: 60 vol %) is introduced through the second valve, and a chromium carbide (CrC) film filmed as the second shading film (light-shielding film, opaque film, non-transmitting film) 14 (see FIG. 3(b)) in a thickness of 600 A by reactive sputtering. Then, at the third target, a mixed gas of Ar and NO (Ar: 80 vol %, NO: 20 vol %) is introduced through the third valve, and a chromium oxynitride (CrON) film is formed as the anti-reflective film 15 (see FIG. 3(c)) in a thickness of 250 A by reactive sputtering. Three layers of film are thus formed continuously. The pressure inside the sputtering chamber 22 during the film formation was 0.3 Pa, the sputtering power at the target for the second shading film 14 (light-shielding film, opaque film, non-transmitting film) was 1650 W, and the deposition rate of the above-mentioned second shading film 14 (light-shielding film, opaque film, non-transmitting film) was 3.4 nm/sec.

After this, the pallet is moved into the vacuum-purged exit chamber 23. Once the sputtering chamber 22 and the exit chamber 23 have been completely separated by the partition, the exit chamber 23 is returned to atmospheric pressure. This yields a photomask blank 31. The pallets are continuously introduced, one after another, into the sputtering chamber 22 when the entry chamber 21 has reached the same state of vacuum as the sputtering chamber 22, so that at all times a plurality of pallets have been introduced into the sputtering chamber 22.

A commercially available apparatus was used to measure the optical characteristics of the photomask blank 31 produced in this manner, whereupon the optical density was 3.0 and the surface reflectance was 12% at a wavelength of 365 nm. Also, no particles were generated from the pallets and there were no film defects, meaning that film quality was good.

Sheet resistance was measured and found to be 25 ohms per square, meaning that good conductivity was achieved.

Figure 10:
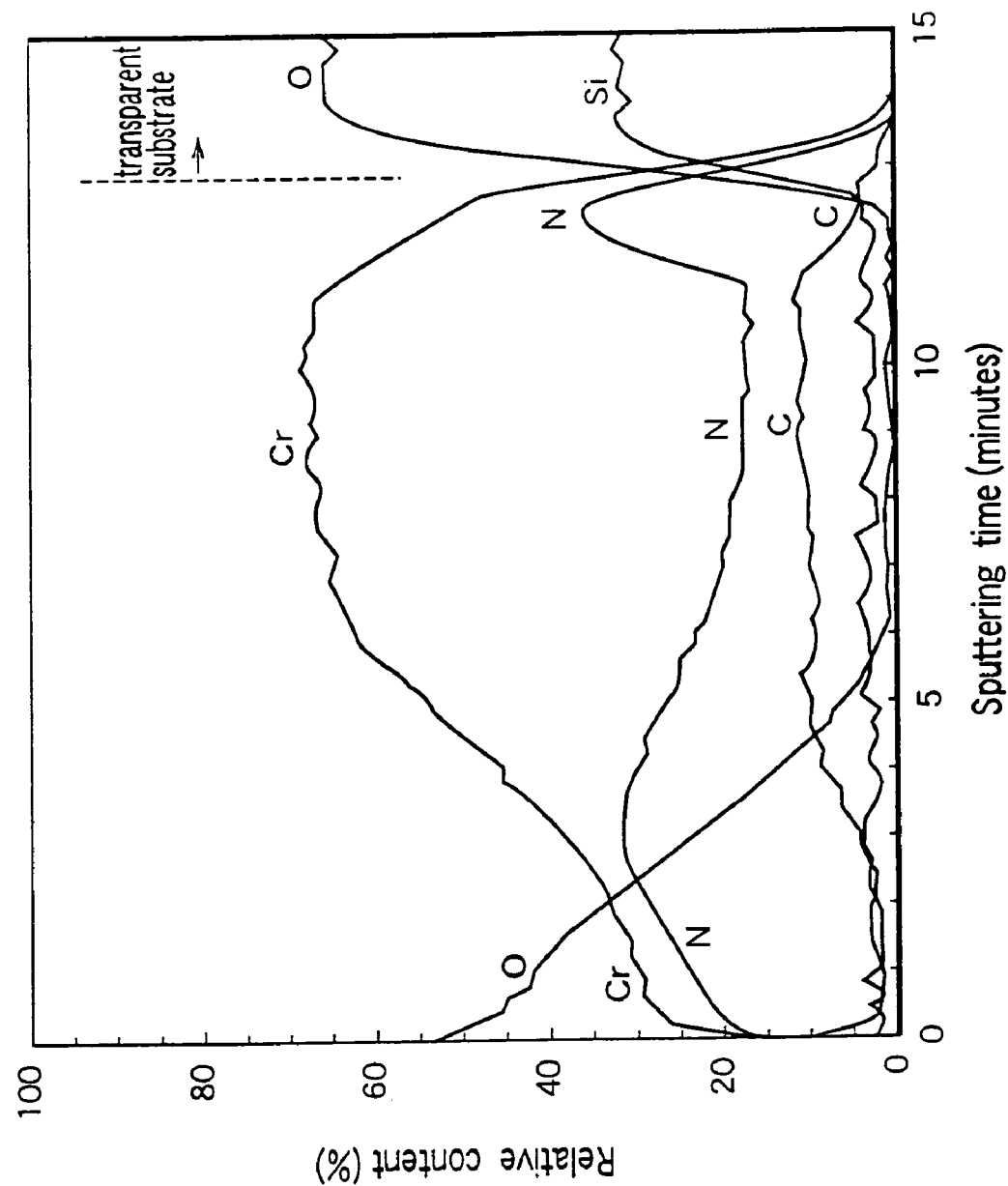
FIG. 10 is a graph of the results of measuring the film composition of the photomask blank in Example 2 by Auger electron spectroscopy.
Figure 11:
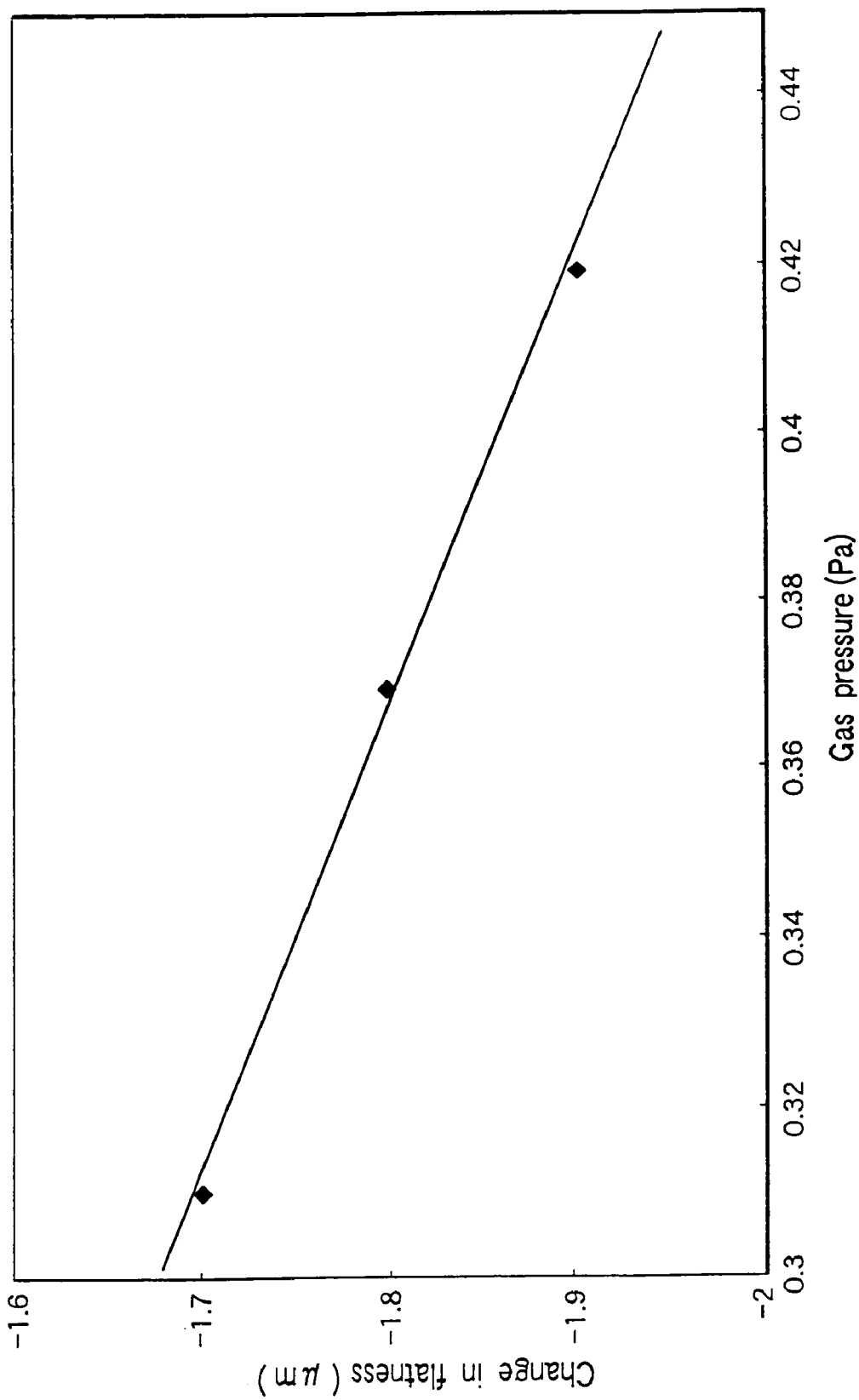
FIG. 11 is a graph of the relationship between gas pressure and substrate warping (change in flatness) in the formation of the CrC film of a conventional photomask blank.

FIG. 10 shows the results of analyzing the film composition of the photomask blank 31 thus obtained. Auger electron spectroscopy (AES) was used in the film composition analysis in FIG. 10. Since helium content is not detected with Auger electron spectroscopy, the film composition analysis results in FIG. 10 show the relative content when the total amount in which other elements (chromium, oxygen, nitrogen, carbon, silicon) were contained, excluding the helium content, was 100 at %. It can be seen from the measurement results obtained by Auger electron spectroscopy in FIG. 10 that the composition varies continuously for the films that make up the photomask blank 31 formed by inline sputtering.

More specifically, in the anti-reflective film 15 and the second shading film 14 (light-shielding film, opaque film, non-transmitting film), the oxygen content continuously decreased and the carbon content continuously increases from the thin film surface side toward the transparent substrate 12 side, and nitrogen is contained in both of these films.

Oxygen is included primarily to control the surface reflectance, and is adjusted to a suitable content in order to obtain the desired optical characteristics. To have an anti-reflective function, oxygen is contained in an amount of 0 to 70 at %, and the amount should average 10 to 60 at % in the film. Carbon is included primarily in order to control the etching rate, and is adjusted to a suitable content so that the pattern will have the desired shape when a mask is produced. The preferred carbon content is 0 to 25 wt %, and the amount should average 0.2 to 20 at % in the film. Nitrogen is included primarily to control the etching rate. In general, the etching rate is slower if chromium contains oxygen or carbon, and nitrogen is included to speed up the etching. The amount is suitably adjusted so that the pattern will have the desired shape when a mask is produced. The preferred nitrogen content is 0 to 45 at %, and the amount should average 10 to 35 at % in the film.

The nitrogen in the nitride film of the first shading film 13 (light-shielding film, opaque film, non-transmitting film) is contained in a relatively larger amount than the nitrogen contained in a the anti-reflective film and the second shading film 14 (light-shielding film, opaque film, non-transmitting film), and the nitrogen content varies continuously.

The nitrogen in the first shading film 13 (light-shielding film, opaque film, non-transmitting film) is included to prevent film defects (black spots) in the pattern, as well as to improve adhesion to the transparent substrate. The etching rate can be raised by including nitrogen in a relatively larger amount than the nitrogen contained in the anti-reflective film 15 and the second shading film 14 (light-shielding film, opaque film, non-transmitting film), so film residue (black spots) left by etching can be prevented. The nitrogen content is 0 to 65 at %, and the amount should average 5 to 60 at % in the film. In addition to nitrogen, the first shading film 13 (light-shielding film, opaque film, non-transmitting film) may also contain small amounts of carbon and oxygen.

Also, continuously varying the above elements (chromium, oxygen, nitrogen, and carbon) allows the cross sectional shape of the photomask pattern to be smoother, without any abrupt steps between films.

In order to better control these optical characteristics and the etching rate for obtaining the desired pattern shape, the photomask blank 31 of the present invention is structured such that in the anti-reflective film 15 and the second shading film 14 (light-shielding film, opaque film, non-transmitting film), the oxygen content continuously decreases and the carbon content continuously increases from the thin film surface side toward the transparent substrate 12 side, the nitrogen in the nitride film if the first shading film 13 (light-shielding film, opaque film, non-transmitting film) is contained in a relatively larger amount than the nitrogen contained in the anti-reflective film 15 and the second shading film 14 (light-shielding film, opaque film, non-transmitting film), and the nitrogen content varies continuously.

Also, just as in Example 1 above, the photomask blank 31 was analyzed by thermal desorption gas analyzer (TDS), and desorption of the mass number (m/e)=4 (He) was observed just as above, confirming that helium (He) was contained in the film.

The change in flatness was measured by the same method as described above which confirmed that here was little change (−0.75 μm) and there was little film stress. The positional precision of the mask pattern was also extremely good in a photomask 32 produced by the same method as in Example 1.

Since the films whose composition varied continuously were formed by inline sputtering, there were no abrupt steps between the films in a cross section of the patterns of the photomask 32, and a smooth, vertical pattern was obtained.

When films were thus formed on a transparent substrate 12, the introduction of helium gas into the atmosphere gas in the formation of a chromium carbide film containing chromium and carbon in which the film stress exhibited tensile stress changes, and a chromium oxide film containing chromium and oxygen, and especially a thick chromium carbide film (CrC), allowed film stress to be suppressed and made it possible to obtain a film with no film stress even in the chromium oxynitride (CrON) film containing oxygen that was continuously formed over the chromium carbide film. Furthermore, the application of inline continuous sputtering allowed a photomask blank 31 with good film quality to be obtained while still permitting mass production.

COMPARATIVE EXAMPLES 1 AND 2

Other than changing the second shading film (light-shielding film, opaque film, non-transmitting film) used in Examples 1 and 2 above to a mixed gas of argon and $CH_4$ (Ar: 90 vol %, $CH_4$: 10 vol %), photomask blanks and photomasks were produced in the same manner as in Examples 1 and 2. As a result, the change in flatness of the photomask blanks was −2.5 μm and −2.8 μm, respectively, and exceeded −2.0 μm, meaning that the positional precision of the photomask pattern was poor. Also, just as in Example 1, desorption of m/e=4 (He) was examined by thermal desorption gas analyzer (TDS) for the photomask blank of Comparative Example 1, whereupon no helium was detected, as shown in FIG. 7.

EXAMPLE 3

An example will now be given of a photomask blank having a shading function (light-shielding function, opaque function, non-transmitting function) and a phase shifting function (phase-shift photomask blank).

A phase-shift photomask blank for use with i-rays (wavelength: 365 mn) was produced by forming a chromium oxide film with a thickness of 1350 Å and an oxygen content of 45 at % by sputtering a chromium target in an atmosphere gas composed of argon, oxygen, and helium over a quartz glass substrate measuring 5 inches×5 inches×0.09 inch. The transmissivity and refractive index of the phase-shift photomask blank thus obtained were measured and found to be 7% and 2.35, respectively. The change in flatness was measured by the same evaluation method as described above, which confirmed that there was little change (−1.5 μm) and little film stress. A phase-shift photomask having the desired pattern was obtained by dry etching using a mixed gas of $CCl_4$ and $O_2$. The amount of phase shift was measured and found to be about 180°. The pattern positional precision was also good, matching the design value.

Using the photomasks and phase-shift photomask of the above Examples 1 to 3, a transfer material such as a semiconductor wafer was exposed and developed, whereupon a good, fine pattern could be formed on the transfer material.

Preferred examples were given above to help describe the present invention, but other examples are also possible. The films formed on the transparent substrate (shading films (light-shielding films, opaque films, non-transmitting films), anti-reflective film, etc.) can be chromium alone or a chromium material containing one or more of carbon, oxygen, nitrogen, and fluorine.

Also, the CrN film (first shading film (light-shielding film, opaque film, non-transmitting film)) formed in Examples 1 and 2 may be omitted. In this case, the film structure would be CrC film/CrON film.

It is also possible for a thin film having at least a shading function (light-shielding function, opaque function, non-transmitting function) to be formed by the method of the present invention above or below the phase-shift pattern of a phase-shift photomask such as a halftone phase-shift photomask.

Films containing mainly chromium were given as examples of the thin film material, but this is not a restriction, and any material can be used as long as it will bring about a tensile stress change (in which the symbol of the above-mentioned change in flatness becomes negative). For instance, the film can be composed of a material containing mainly a transition metal (such as titanium, nickel, copper, molybdenum, tantalum, or tungsten).

The present invention can be utilized to obtain a photomask used as a mask for fine pattern transfer in the process of manufacturing an IC (semiconductor integrated circuit) or LSI circuit (large-scale integrated circuit), as well as a photomask blank used to produce this photomask. In particular, the thin films formed over a transparent substrate in order to form a fine mask pattern are not under enough stress to cause warping that would be harmful to the transparent substrate, and it is possible to obtain a photomask blank and photomask that have good film quality and can be mass-produced at a high yield.

What is claimed is:

1. A photomask blank comprising a thin film having a light-shielding function formed over a transparent substrate, and a phase shifting film formed over the thin film or between the transparent substrate and the thin film,
    wherein the thin film is a light-shielding film and the light shielding film contains helium.

2. A photomask, wherein a phase shifting pattern is formed by patterning the phase shifting film and the thin film formed over the transparent substrate of the photomask blank according to claim 1.

3. A method of forming a fine pattern, in which the fine pattern is formed over a substrate by photolithography,
    wherein the photomask according to claim 2 is used as a mask used in transferring the fine pattern.

4. A phase shifting mask blank comprising a thin film having a light-shielding function and a phase shifting function formed over a transparent substrate,
    wherein the thin film contains at least one transition metal selected from the group consisting of Ti, Ni, Cu, Mo, Ta, W, a plurality of transition metals, and compounds thereof, at least one of elements selected from the group consisting of carbon, oxygen and nitrogen, and contains helium.

5. A phase shifting mask, wherein a phase shifting pattern is formed by patterning the thin film formed on the transparent substrate of the phase shifting mask blank according to claim 4.

6. A method of forming a fine pattern, in which the fine pattern is formed over a substrate by photolithography,
    wherein the phase shifting mask according to claim 5 is used as a mask used in transferring the fine pattern.

7. The phase shifting mask blank according to claim 4, wherein a light-shielding film is formed on said thin film or between said transparent substrate and said thin film.

8. The phase shifting mask blank according to claim 7, wherein said light-shielding film is composed of a material containing Cr single element, or at least one kind of carbon, oxygen, nitrogen, and fluorine in addition to Cr.

9. The phase shifting mask blank according to claim 8, wherein said light-shielding film further contains helium.

10. The phase shifting mask blank according to claim 9, wherein said light-shielding film contains helium in such an amount that the light-shielding film has a film stress so that a mask pattern obtained by patterning the light-shielding film becomes a desired pattern with positional accuracy.

11. The phase shifting mask blank according to claim 8, wherein said light-shielding film is a laminated film of the light-shielding film containing carbon and an anti-reflective film containing oxygen.

12. The phase shifting mask blank according to claim 8, wherein a nitride film containing Cr and nitrogen is formed between said light-shielding film and said thin film.

13. The phase shifting mask blank according to claim 1, wherein said light-shielding film is composed of a material containing Cr single element or at least one kind of carbon, oxygen, nitrogen, and fluorine in addition to Cr.

14. The phase shifting mask blank according to claim 13, wherein said light-shielding film contains helium in such an amount that the light-shielding film has a film stress so that a mask pattern obtained by patterning the light-shielding film becomes a desired pattern with positional accuracy.

15. The phase shifting mask blank according to claim 13, wherein said light-shielding film is a laminated film of the light-shielding film containing carbon and an anti-reflective film containing oxygen.

16. The phase shifting mask blank according to claim 13, wherein a nitride film containing Cr and nitrogen is formed between said light-shielding film and said phase shifting film.

* * * * *